United States Patent [19]
Jeng et al.

[11] Patent Number: 6,037,211
[45] Date of Patent: Mar. 14, 2000

[54] METHOD OF FABRICATING CONTACT HOLES IN HIGH DENSITY INTEGRATED CIRCUITS USING POLYSILICON LANDING PLUG AND SELF-ALIGNED ETCHING PROCESSES

[75] Inventors: Erik S. Jeng, Taipei; Yue-Feng Chen, Hsinchu; Bi-Ling Chen, Taipei, all of Taiwan

[73] Assignee: Vanguard International Semiconductor Corporation, Taiwan

[21] Appl. No.: 08/841,836

[22] Filed: May 5, 1997

[51] Int. Cl.[7] .......................... H01L 21/28; H01L 21/336; H01L 21/8242
[52] U.S. Cl. .......................... 438/253; 438/586; 438/595
[58] Field of Search ..................... 438/639, 586, 438/595, 672, FOR 196, FOR 346

[56] References Cited

U.S. PATENT DOCUMENTS

| | | |
|---|---|---|
| 5,235,199 | 8/1993 | Hamamoto et al. . |
| 5,248,628 | 9/1993 | Okabe et al. . |
| 5,279,989 | 1/1994 | Kim ........................................ 437/195 |
| 5,296,400 | 3/1994 | Park et al. ................................ 437/52 |
| 5,332,685 | 7/1994 | Park et al. . |
| 5,563,089 | 10/1996 | Jost et al. . |
| 5,663,092 | 9/1997 | Lee .......................................... 438/253 |
| 5,688,713 | 11/1997 | Linliu et al. .............................. 437/60 |
| 5,721,154 | 2/1998 | Jeng ......................................... 437/60 |
| 5,780,339 | 7/1998 | Liu et al. ................................. 438/253 |
| 5,792,687 | 8/1998 | Jeng et al. ............................... 438/253 |
| 5,914,521 | 5/1999 | Jeng et al. . |
| 5,956,594 | 9/1999 | Yang et al. . |

OTHER PUBLICATIONS

Kang, H.K. et al., "Highly Manufacturable Process Technology for Reliable 256 Mbit and 1 Gbit DRAMs," *Technical Draft of IEDM*, pp. 635–638, 1994.

Sim, S.P. et al., "A New Planar Stacked Technology (PST) for Scaled and Embedded DRAMs," *Technical Draft of IEDM*, pp. 597–600, 1996.

Primary Examiner—George Fourson
Assistant Examiner—Elizabeth Abbott
Attorney, Agent, or Firm—Christensen O'Connor Johnson Kindness PLLC

[57] ABSTRACT

A method of fabricating contact holes in high density integrated circuits uses landing plugs to reduce the aspect ratio of the the node contact holes in order to improve the processing window of deep contact holes. Along with nitride spacers on the sidewalls of a transistor gate structure, polysilicon hard masks and polysilicon spacers are used as etching masks in a self-aligned contact process. In addition, the landing plugs incorporate the polysilicon spacers as part of landing plug to increase the contact area. As a result, wide contact processing windows can be achieved in high density integrated circuits.

19 Claims, 6 Drawing Sheets

– continued –

METHOD OF FABRICATING CONTACT HOLES IN HIGH DENSITY INTEGRATED CIRCUITS USING POLYSILICON LANDING PLUG AND SELF-ALIGNED ETCHING PROCESSES

FIELD OF THE INVENTION

The present invention relates to interconnect technology in semiconductor integrated circuits and, more particularly, to a method of forming contacts in high density integrated circuits.

BACKGROUND OF THE INVENTION

Generally, dynamic random access memories (DRAMs) have a large number of memory cells each including a metal-oxide-semiconductor field effect transistor (MOSFET) and a capacitor. Conventional fabrication of DRAM devices typically have two separate contact patterning processes. One is for forming bit line contacts and the other is for forming capacitor node contacts.

In this conventional method, the distance from the capacitor node to substrate is relatively large, more particularly, for the structure of capacitor-over-bitline DRAMs. Consequently, the node contact hole has a relatively high aspect ratio. As is well known, forming a contact hole with high aspect ratio is relatively difficult using standard photolithography and etching techniques, often requiring overetching to ensure that the contact hole is complete. This overetching may cause short-circuit defects. In addition, filling the high aspect ratio contact hole with a conductive material can also be difficult, thereby increasing the risk of open-circuit defects. Thus, there is a need for a method to form contacts in a high density integrated circuit without the problems associated with high aspect ratio contact holes.

SUMMARY OF THE INVENTION

In accordance with the present invention, a method of fabricating contacts in semiconductor integrated circuits is provided. In one embodiment adapted for fabricating DRAMs, the method includes forming a first dielectric layer, for isolation, on a substrate having gate and word line structures formed thereon and S/D regions formed therein. Then a second dielectric layer is formed on the first dielectric layer to reduce the topography. This second dielectric layer is significantly thinner than the comparable dielectric layer of the aforementioned conventional process. A first conductive layer is formed on the second dielectric layer, and then patterned and etched to form conductive hard masks for defining the contact holes. Then portions of the second dielectric not covered by the patterned first conductive layer are removed to form relatively shallow trenches.

A second conductive layer is then formed on the patterned first conductive layer and in the shallow trenches in the second dielectric layer. The second conductive layer is then etched to form conductive spacers on the sidewalls of the trenches. Then contact holes are formed in the second dielectric layer using the second conductive layer and conductive spacers has a hard mask in a self-aligned process. The contact holes are then filled with a conductive material to form landing plugs contacting the S/D regions in the substrate. Because of the reduced thickness of the second dielectric layer, high aspect ratio problems are avoided during the formation of these contact holes and landing plugs. The conductive spacers serve to increase the landing area of the landing plug.

A third dielectric layer is then formed on the second dielectric layer and the landing plugs, forming an interlayer dielectric (ILD) layer. The third dielectric layer is then patterned and etched to form a second contact hole for a bit line contact to a selected landing plug. A conductive contact and bit line is then formed on the third dielectric layer, contacting the selected landing plug. Because of the enlarged landing area provided by the aforementioned conductive spacers, defects caused by misalignment in forming these contacts are significantly reduced.

A fourth dielectric layer is formed on the third dielectric layer and the bit line to serve as another ILD layer. Contact holes are then patterned and etched through the third and fourth dielectric layers to expose selected landing plugs. As described above, the enlarged landing areas of the selected landing plugs reduce misalignment defects. Another conductive layer is then formed on the fourth dielectric layer and in the contact holes. The fourth dielectric layer is formed to have a thickness small enough to avoid high aspect ratio problems in fabricating these contacts. This conductive layer is then patterned and etched to form bottom capacitor nodes for the DRAM memory cells. The capacitor dielectric and upper capacitor nodes are then formed using conventional processes. Because contacts formed according to the present invention use self-aligned landing plugs, the short-circuit and open-circuit defects associated with deep contact holes are avoided. In addition, the enlarged landing areas of the landing plugs reduce misalignment defects.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

A method of fabricating contacts using polysilicon landing plug and self-aligned etching according to the present invention is described herein. FIGS. 1–12 are cross section views of various stages in fabricating contacts in accordance with one embodiment of the present invention. This embodiment is advantageously used in forming interconnects in a DRAM device. In light of the present description, those persons skilled in the art of integrated circuit fabrication can adapt the present invention for use in integrated circuit applications other than DRAMs without experimentation.

Figure 1:
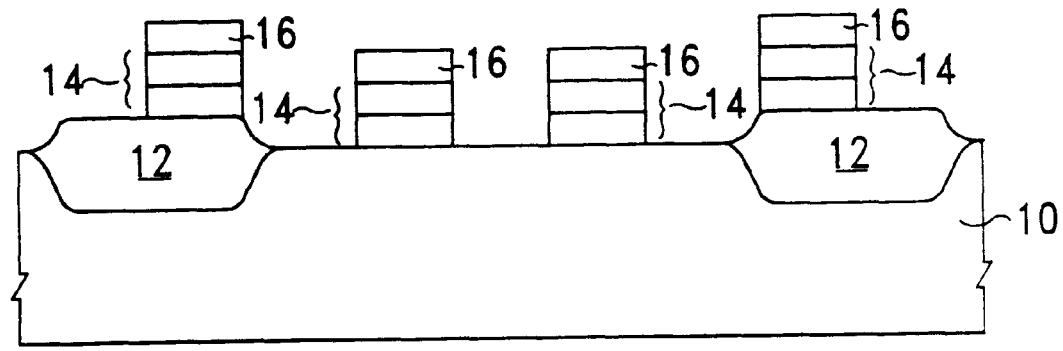
FIGS. 1–12 are a cross sectional views of various stages in fabricating contacts in accordance with one embodiment of the present invention.

Referring to FIG. 1, a single crystal substrate 10 with a <100> crystallographic orientation is provided. Thick field oxide (FOX) regions 12 are formed to provide isolation between devices on the substrate 10. The FOX regions 12 are created in a conventional manner. In this embodiment, the FOX regions 12 are formed via standard photolithography and dry etching steps to define the FOX regions 12 using a silicon nitride layer formed on the substrate. The exposed portions of the substrate are then subjected to thermal oxidation in an oxygen-steam environment to grow the FOX regions 2 to a thickness of about 4000–6000 angstroms. The silicon nitride layer is then removed. Next, a silicon dioxide layer is created on the top of surface of the substrate 10 to serve as the gate oxide for subsequently formed metal oxide silicon field effect transistors. In this embodiment, the silicon dioxide layer is formed by using an oxygen-steam ambient, at a temperature of about 850–1000° C. Alternatively, the oxide layer may be formed using any suitable oxide chemical compositions and procedures. In this embodiment, the silicon dioxide layer is formed to a thickness of approximately 100 angstroms.

A first polysilicon layer is then formed over the FOX regions 12 and the silicon dioxide layer using a low pressure chemical vapor deposition (LPCVD) process. The first polysilicon layer is doped in order to form a conductive gate for the MOSFET structure. In this embodiment, the first polysilicon layer has a thickness of about 500–2000 angstroms and is doped with phosphorus dopants at a concentration of about $10^{20}$–$10^{21}$ ions/cm$^2$. A tungsten silicide layer is formed on the first polysilicon layer to improve interconnection between the gate polysilicon and subsequently formed metal interconnects. The first polysilicon layer and the tungsten silicide layer are stacked to become a polycide layer 14. A first dielectric layer 16 is then deposited using conventional manners. In this embodiment, the first dielectric layer 16 is a silicon nitride layer. The thickness of first dielectric layer 16 is about 2000 angstroms. Next, standard photolithography and etching process are performed to form gate structures 14 and 16.

Figure 2:
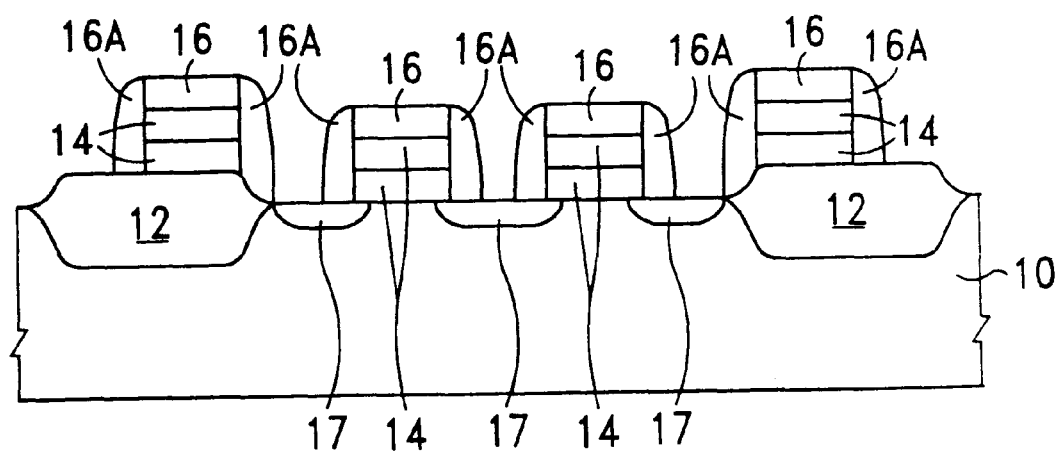

FIG. 2 shows the next stage of this invention. Sidewall spacers 16A are subsequently formed on the sidewalls of the gate structure 14 and 16. In this embodiment, the sidewall spacer 16A is formed from silicon nitride that was conformally deposited over the gate structures and then anisotropically etched. Thereafter, active regions 17 (i.e., MOSFET's source and drain) are formed, using well-known processes to implant appropriate impurities in those regions and activate the impurities. In view of this disclosure, those skilled in the art of DRAM fabrication can modify this embodiment to form lightly doped drain (LDD) structures, without undue experimentation.

Figure 3:
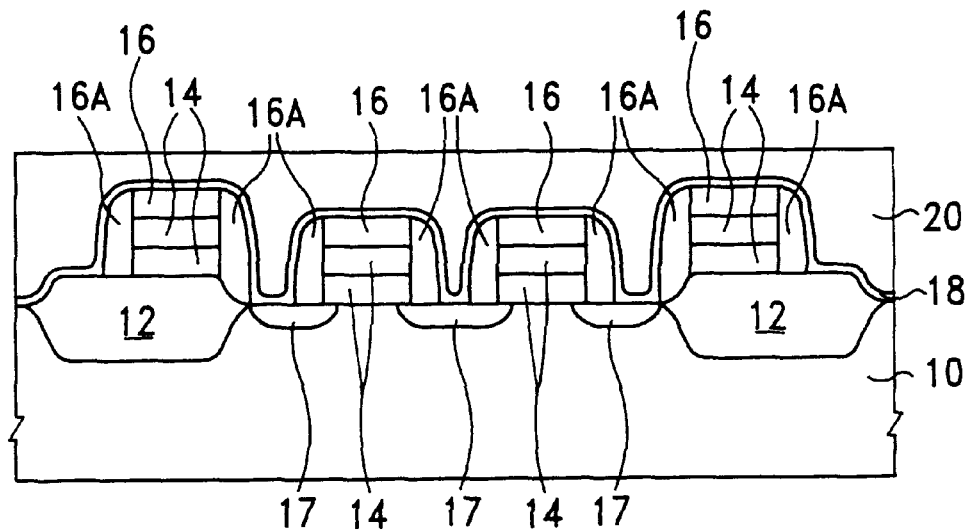

Referring to FIG. 3, a second dielectric layer 18 is deposited on the gate structures and the substrate 10 for isolation. The second dielectric layer 18, in the preferred embodiment, is composed of oxide such as tetraethylorthosilicate (TEOS) formed using a standard chemical vapor deposition process to a thickness of about 1000 angstroms. A third dielectric layer 20 is formed on the second dielectric layer 18. The third dielectric layer 20 is composed of oxide such as borophosphosilicate (BPSG) deposited using a standard chemical vapor deposition process to a thickness of about 9000 angstroms. The third dielectric layer 20 is planarized so that the third dielectric layer 20 has a thickness over the second dielectric layer 18 of about 2000 angstroms, after polishing. In this embodiment, the planarization step can be performed using a chemical mechanical polish process (CMP) or a etching back process. The etching back process can be performed by any suitable process. The resulting structures is shown in FIG. 3.

Figure 4:
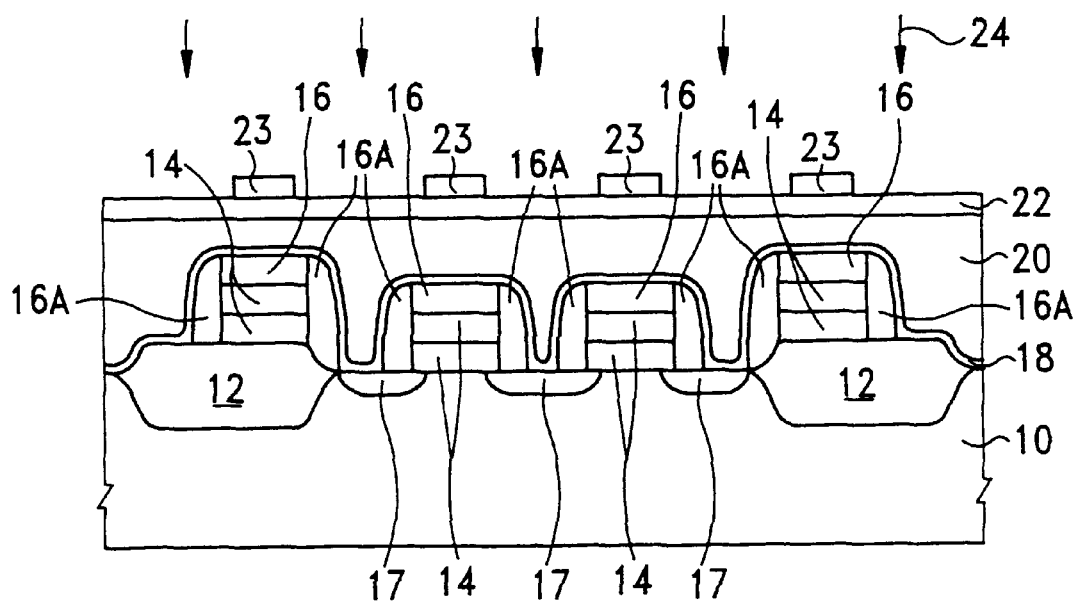
Figure 5:
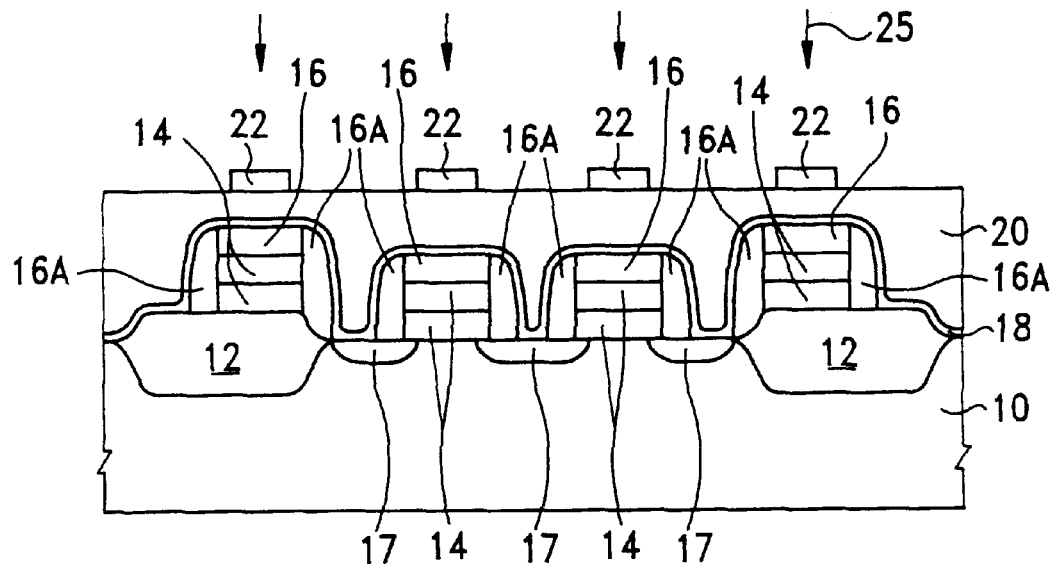

Turning to FIG. 4, a second polysilicon layer 22 is formed on the third dielectric layer 20. In this embodiment, the second polysilicon layer is deposited by using conventional chemical vapor deposition process. The second polysilicon layer has a thickness of about 2000 angstroms and is doped with phosphorus dopants at a concentration of about $10^{20}$–$10^{21}$ ions/cm$^2$. A photoresist layer 23 is then formed on the second polysilicon layer 22 to define polysilicon hard masks over the gate structures. An anisotropic etching process (indicated by the arrows 24) is performed to remove the portions of the second polysilicon layer 22 left uncovered by the patterned photoresist layer 23. The etching process can be any suitable etching process such as, for example, a conventional reactive ion etching (RIE) process. The resulting structure is illustrated in FIG. 5. Afterwards, the third dielectric layer 20 is anisotropically etched (indicated by the arrows 25), using the residual portions of the second polysilicon layer 22 as a hard mask.

Figure 6:
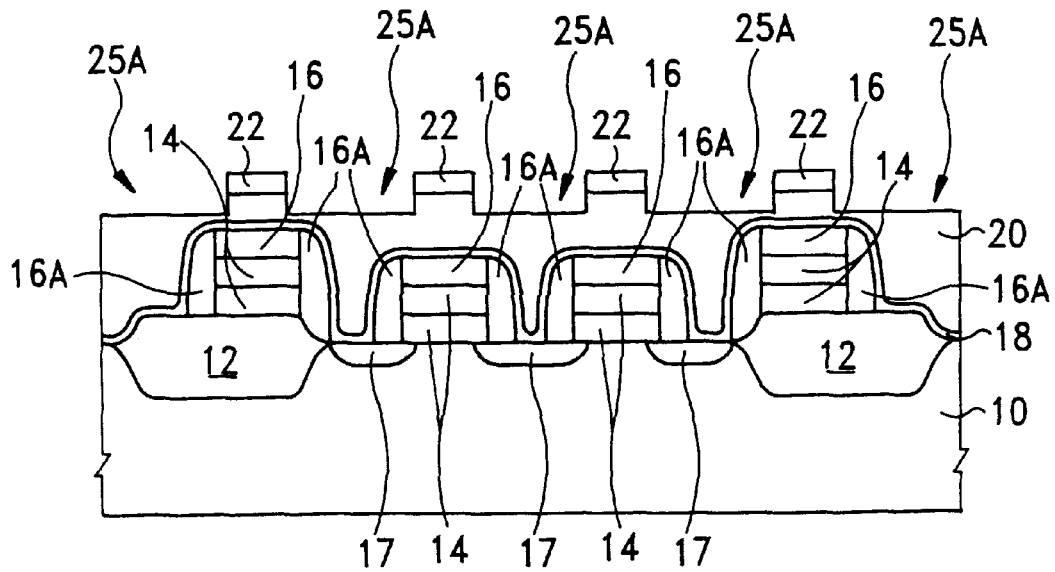

Turning to FIG. 6, as a result of the etching process, shallow trenches 25A are formed in the third dielectric layer 20, roughly aligned with the S/D regions 17 of the MOSFETs. In this embodiment, the etching process (indicated by the arrows 25 in FIG. 5) controls the etching time to adjust the depth of the trenches 25A so that the trenches 25A do not expose the second dielectric layer 18. In this embodiment, the shallow trenches 25A has the depth of about 1000 angstroms. The resulting structure is shown in FIG. 6.

Figure 7:
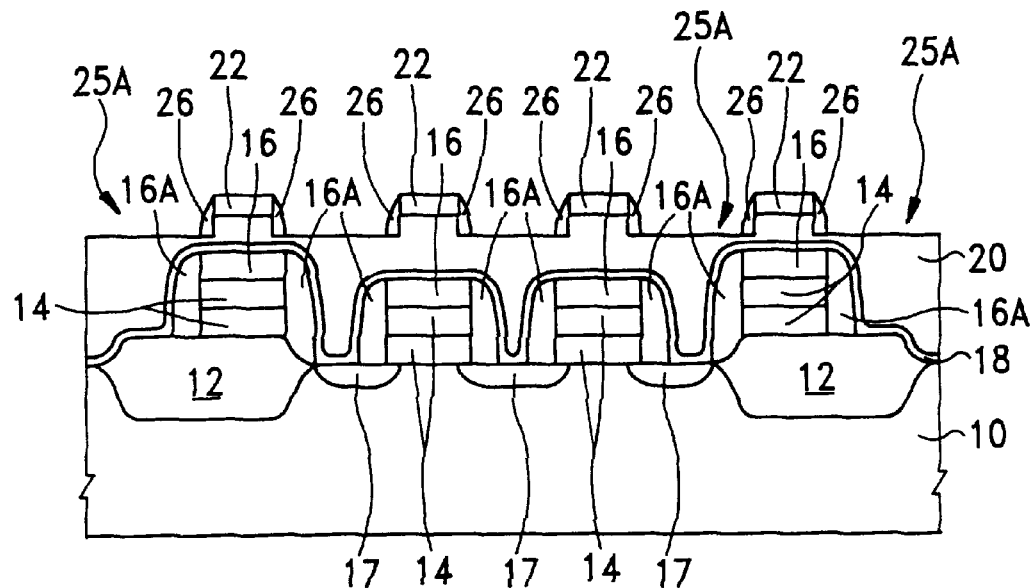

FIG. 7 shows the next stage of this invention. A third polysilicon layer is conformally deposited on the second polysilicon layer 22 and in the trenches 25A. In this embodiment, the third polysilicon layer is deposited by using conventional chemical vapor deposition process. The third polysilicon layer has a thickness of about 1000 angstroms and is doped with phosphorus dopants at a concentration of about $10^{20}$–$10^{21}$ ions/cm$^2$. Then, an etching back process is performed to form polysilicon spacers 26 on the sidewalls of the trenches 25A. In this embodiment, the etching back process can be performed by any suitable etching process such as a plasma etching process. The third dielectric layer 20 serves as an end-stop point.

Figure 8:
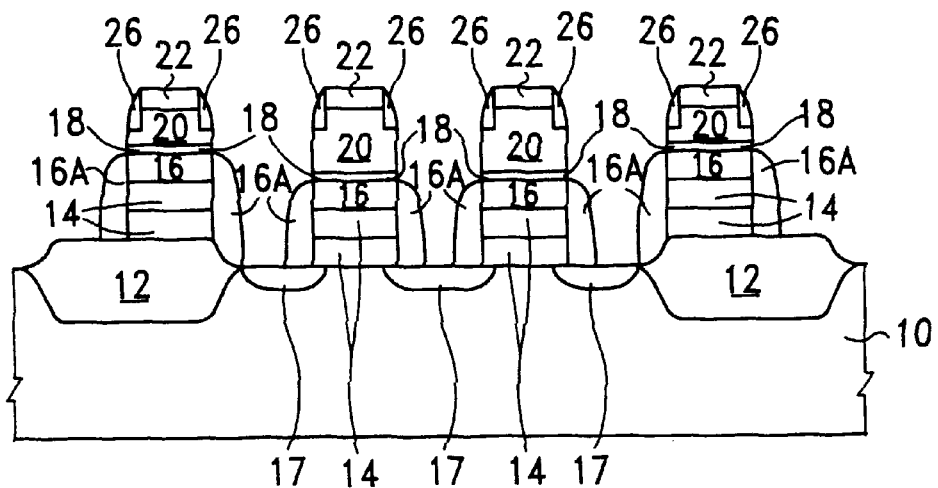

Referring to FIG. 8, the third dielectric layer 20 and the second dielectric layer 18 are removed to form contact holes. In this embodiment, an etching process is performed to remove through the third dielectric layer 20 and the second dielectric layer 18 to the S/D regions 17 for forming the contact holes, wherein the sidewall spacers 16A are exposed and used to serve as portions of sidewalls of the contact holes. In this embodiment, the etching process is performed using a RIE process with a high selectivity ratio for the oxides of the dielectric layer 18 and 20 relative to the polysilicon of the spacers 26 and polysilicon hard masks formed by the second polysiliocn layer 22. In additoin, the RIE process has a high selectivity ratio for the oxides relative to the nitride of the spacers 16A. As a result, the contact holes are formed by using a self-aligned process. In this embodiment, the RIE process has a selectivity ratio of oxide to polysiliocn of about 20:1 and a selectivity ratio of oxide to nitride of about 15:1. The resulting structure is illustrated in FIG. 8.

Figure 9:
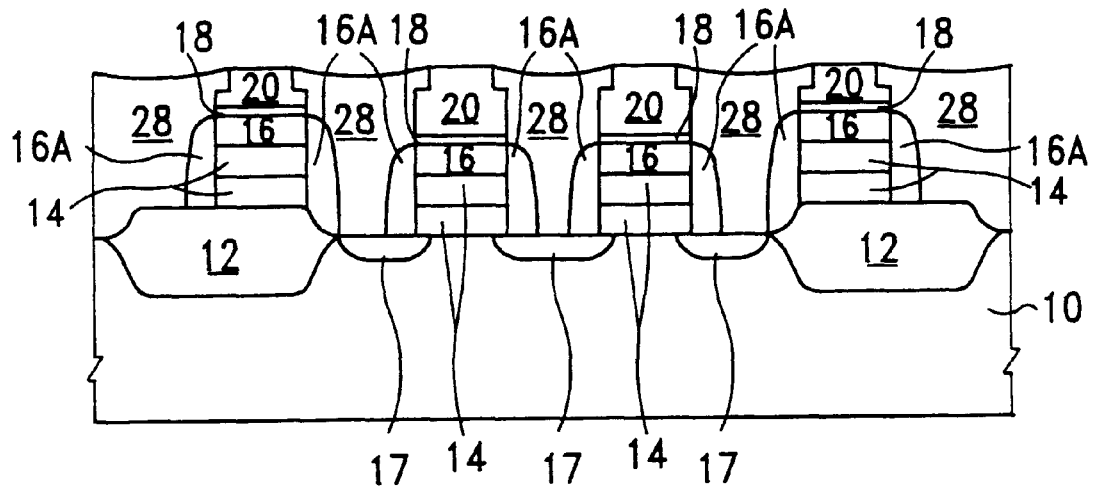

After the contact holes are formed, a fourth polysilicon layer 28 is formed on the polysilicon layer 22, polysilicon spacer 26 and in the contacts. In this embodiment, the fourth polysilicon layer is deposited by using conventional chemical vapor deposition process. The fourth polysilicon layer has a thickness of about 1000 angstroms over the polysilicon layer 22 and is doped with phosphorus dopants at a concentration of about $10^{20}$–$10^{21}$ ions/cm$^2$. Then, an etching back process is performed to remove the polysilicon layer 22, and spacers 26. In addition, this etching back process remove the upper portion of the fourth polysilicon layer 28 to form polysilicon landing plugs 28. In this embodiment, a standard plasma etching process is performed to etch back the polysilicon layers, using the third dielectric layer 20 as an etchstop. The resulting structure is shown in FIG. 9.

Figure 10:
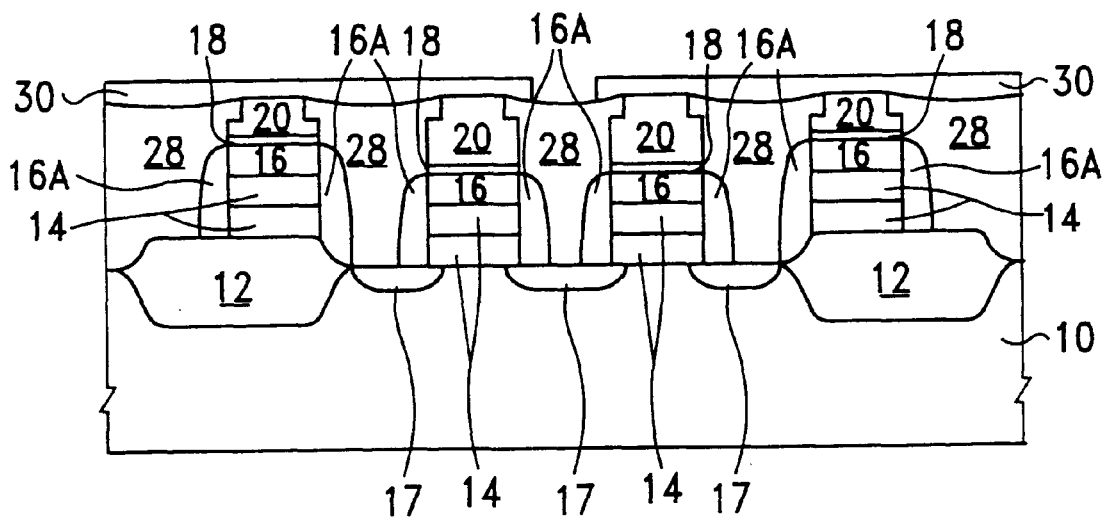

Turning to FIG. 10, a fourth dielectric layer 30 is formed on the third dielectric layer 20 and the polysilicon plugs 28. In this embodiment, the fourth dielectric layer 30 can be any suitable dielectric material such as TEOS oxide. The fourth dielectric layer 30 is formed by any suitable chemical vapor deposition process. The thickness of the fourth dielectric layer 30 is about 1000 angstroms. Thereafter, the fourth dielectric layer 30 is patterned and etched using standard techniques to form second contact holes that expose a portion of selected landing plugs 28 corresponding to bit lines for the DRAM device. The resulting structure is illustrated in FIG. 10.

Figure 11:
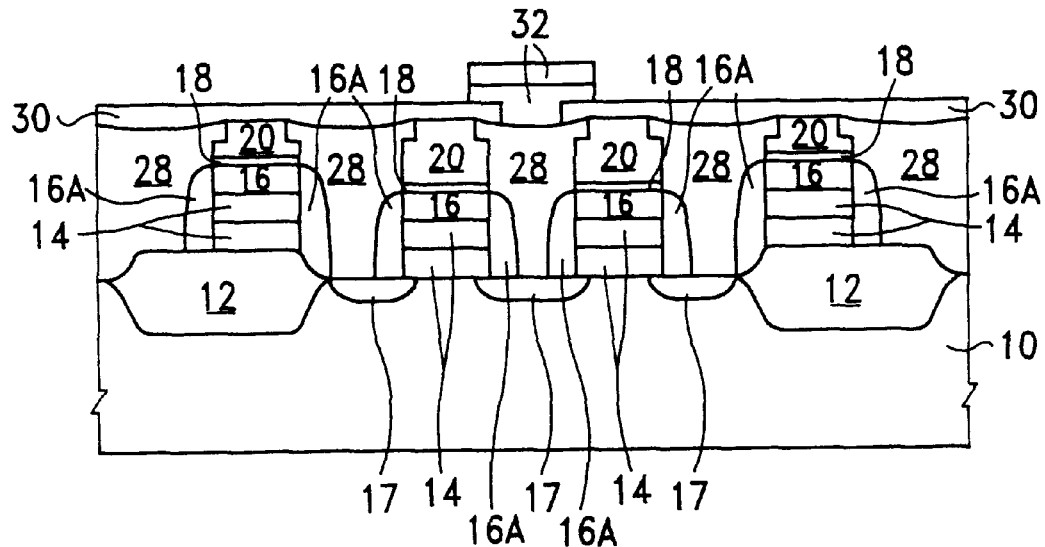

Then, a fifth polysilicon layer is deposited on the fourth dielectric layer 30 and in the second contacts. In this embodiment, the fifth polysilicon layer has a thickness of about 1000 angstroms and is doped with phosphorus dopants at a concentration of about $10^{20}$–$10^{21}$ ions/cm$^2$. A tungsten silicide layer is then formed on the fifth polysilicon layer to improve interconnection between the polysilicon plug and subsequently formed bit line. The fifth polysilicon layer and the tungsten silicide layer are stacked to become a polycide layer 32. After that, the polycide layer 32 is patterned and etched to form a bit line. In this embodiment, a standard patterning process and etching process is performed in this step. The resulting structure is shown in FIG. 11.

Figure 12:
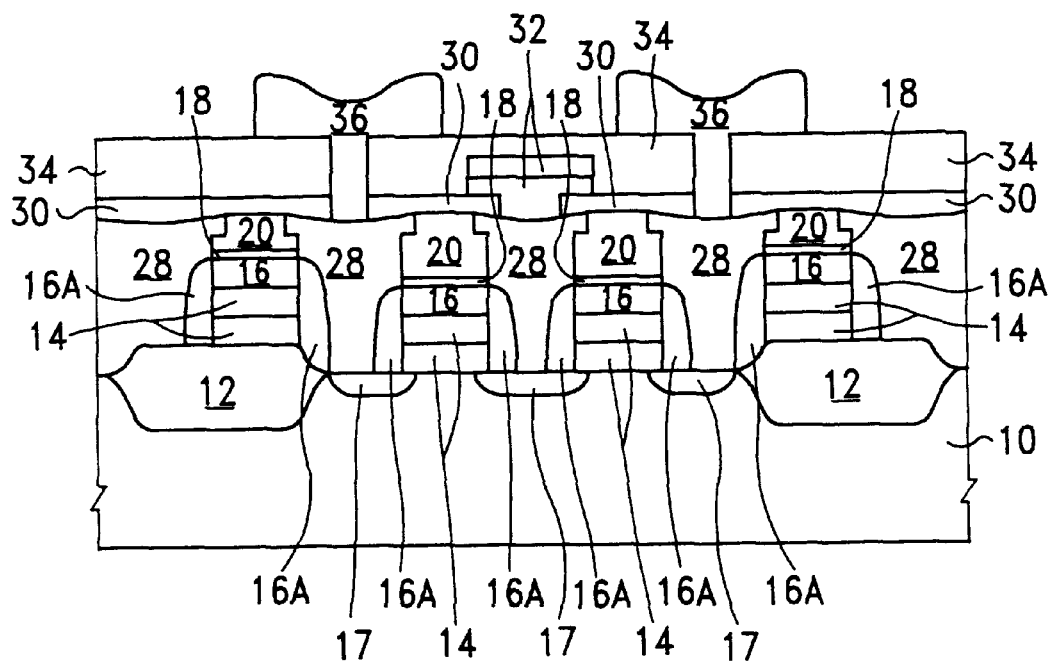

FIG. 12 shows a final stage of this embodiment of the present invention. A fifth dielectric layer 34 is subsequently formed on the fourth dielectric layer 30 and the bit line 32. The fifth dielectric layer 34 can be formed of any suitable material such as, for example, BPSG. Preferably, the fifth dielectric layer 34 is formed using a conventional chemical vapor deposition process. The thickness of the fifth dielectric layer 34 is about 4500 angstroms, but can be any suitable thickness in the range of 2500 to 9000 angstroms. In this embodiment, a standard reflow process is then performed to planarize the fifth dielectric layer 34.

Standard processes are then used to form and pattern a photoresist layer (not shown) on the fifth dielectric layer 34 to define contact holes for capacitor storage nodes of the DRAM device. The photoresist layer leaves uncovered the contact holes, which are then etched through the fifth dielectric layer 34 and the fourth dielectric layer 30 to expose a portion of the polysilicon plugs 28 corresponding to the capacitor storage nodes.

A sixth polysilicon layer 36 is then formed on the fifth dielectric layer 34 and in the contact hole. The sixth polysilicon layer 36 is formed using a conventional LPCVD process to completely fill the contact holes. The thickness of the sixth polysilicon layer 36 on the top surface of the fifth dielectric layer 34 is about 8000 angstroms. The sixth polysilicon layer 36 doped with phosphorus dopants with a concentration of about $10^{20}$–$10^{21}$ ions/cm$^2$ to increase conductivity. Any suitable method may be used to dope the polysilicon such as, for example, in-situ doping. The capacitor is then completed by forming a capacitor dielectric (e.g. ONO) and upper storage node using any suitable conventional processes. The resulting structure is shown in FIG. 12.

The method of this embodiment of the present invention takes several advantages of the polysilicon landing plug and self-aligned contact etching in several ways. For example, forming the polysilicon landing plugs reduce the aspect ratio of the contact holes to improve the processing window of deep contact holes. In addition, wide contact processing windows are formed by the combination of self-aligned contact etching and polysilicon hard-masked contact etching. Further, the formation of polysilicon spacers increases the landing contact area of polysilicon plug. As a result, a better photolithography overlay between contacts and plugs can be achieved.

Although specific embodiment has been illustrated and described, it will be obvious to those skilled in the art that various modifications may be made without departing from the which is intended to be limited solely by the appended claims.

The embodiments of the invention in which an exclusive property or privilege is claimed are defined as follows:

1. A method of fabricating a contact in a semiconductor integrated circuit with a self-aligned landing plug, said method comprising:

forming gate structures with first sidewall spacers on a substrate and source/drain regions in said substrate, wherein said source/drain regions are adjacent to said gate structure;

forming a first dielectric layer on said substrate to cover said gate structures and said source/drain regions;

forming conductive hard masks on said first dielectric layer, wherein each said conductive hard mask is aligned to each said gate structure;

etching said first dielectric layer by using said conductive hard masks as etching masks to remove a portion of said first dielectric layer to form trenches on said first dielectric layer, wherein portions of said trenches are aligned to said source/drain regions;

forming conductive spacers on sidewalls of said trenches and on sidewalls of said conductive hard masks;

selectively etching said first dielectric layer by using said conductive hard masks and said conductive spacers as etching masks to expose said first sidewall spacers and the source/drain regions for forming first contact holes on said substrate, wherein an etching rate of said first dielectric layer is higher than that of said sidewall spacers and said conductive hard masks;

forming conductive landing plugs in said first contact holes;

removing said conductive hard masks, a portion of said conductive spacers and a portion of conductive landing plugs above the etched first dielectric layer, wherein the etched conductive spacers serve as a portion of said conductive landing plugs;

forming a second dielectric layer on said conductive landing plugs and the etched first dielectric layer;

etching said second dielectric layer to form a second contact hole for exposing a portion of an upper surface of a selected conductive landing plug of said conductive landing plugs;

forming a bit line structure on said second dielectric layer to electrically connect said selected conductive landing plug via said second contact hole;

forming a third dielectric layer to cover said second dielectric layer and said bit line structure;

etching said third dielectric layer to form third contact holes in said third dielectric layer for exposing a portion of said conductive landing plugs other than said selected conductive landing plug; and forming capacitor nodes on said third dielectric layer connecting to said portion of said conductive landing plugs through said third contact holes.

2. The method according to claim 1, wherein said first dielectric spacer comprises nitride.

3. The method according to claim 1, wherein said conductive hard masks comprise doped polysilicon.

4. The method according to claim 1, wherein said conductive spacers comprise doped polysilicon.

5. The method according to claim 1, wherein said first dielectric layer comprises borophosphosilicate glass.

6. The method according to claim 5, further comprising the step of forming a thin oxide layer on said gate structures and said substrate before forming said first dielectric layer.

7. The method according to claim 1, wherein said gate structures comprise silicide.

8. The method according to claim 1, wherein said conductive landing plugs comprise doped polysilicon.

9. The method according to claim 1, wherein said selective etching procedure for forming said first contact holes is a reactive ion etching (RIE) process.

10. The method according to claim 9, wherein said reactive ion etching (RIE) process has a selectivity ratio of oxide to polysilicon of at least 20:1.

11. The method according to claim 9, wherein said reactive ion etching (RIE) process has a selectivity ratio of oxide to nitride of at least 15:1.

12. A method of fabricating a contact in a semiconductor integrated circuit with a self-aligned landing plug, said method comprising:

forming gate structures on a substrate and source/drain regions adjacent to said gate structures in said substrate;

forming nitride spacers on sidewalls of said gate structures;

forming a dielectric layer on outer surfaces of said nitride spacers, said gate structures and said substrate;

forming a first oxide layer on said dielectric layer to cover said gate structures and said source/drain regions;

forming a first conductive layer on said first oxide layer;

patterning and etching said first conductive layer to form conductive hard masks on said first oxide layer, wherein each said conductive hard mask is aligned to each said gate structure;

etching said first oxide layer by using said conductive hard masks as etching masks to remove a portion of said first oxide layer to form trenches on said first oxide layer, wherein portions of said trenches are aligned to said source/drain regions;

forming a second conductive layer on outer surfaces of said conductive hard masks and on sidewalls and bottoms of said trenches;

etching said second conductive layer to form conductive spacers on said sidewalls of said trenches and on said sidewalls of said conductive hard masks;

selectively etching said first oxide layer by using said conductive hard masks and said conductive spacers as etching masks to expose said nitride spacers of said gate structures and the source/drain regions for forming first contact holes on said substrate, wherein said selective etching procedure has a selectivity ratio of at least 20:1 of said first oxide layer to said conductive hard masks, and a selectivity ratio of at least 15:1 of said first oxide layer to said nitride spacers;

forming conductive landing plugs in said first contact holes;

etching back said conductive hard masks, said conductive spacers and said conductive landing plugs to remove said conductive hard masks, a portion of said conductive spacers and a portion of conductive landing plugs above the etched first oxide layer, wherein the etched conductive spacers serve as a portion of said conductive landing plugs;

forming a second oxide layer on said conductive landing plugs and the etched first oxide layer;

etching said second oxide layer to form a second contact hole for exposing a portion of an upper surface of a selected conductive landing plug of said conductive landing plugs;

forming a bit line structure on said second oxide layer to electrically connect said selected said conductive landing plug via said second contact hole;

forming a third oxide layer to cover said second oxide layer and said bit line structure;

etching said third oxide layer to form third contact holes in said third oxide layer for exposing a portion of said conductive landing plugs other than said selected landing plug; and forming capacitor nodes on said third oxide layer connecting to said portion of said conductive landing plugs through said third contact holes.

13. The method according to claim 12, wherein said conductive hard masks comprise doped polysilicon.

14. The method according to claim 12, wherein said conductive spacers comprises doped polysilicon.

15. The method according to claim 12, wherein said first oxide layer comprises borophosphosilicate glass.

16. The method according to claim 12, wherein said gate structures comprise silicide.

17. The method according to claim 12, wherein said conductive landing plugs comprise doped polysilicon.

18. The method according to claim 12, wherein said selective etching procedure for etching said first oxide layer is a reactive ion etching (RIE) process.

19. The method according to claim 12, wherein the upper surface of the conductive landing plugs is larger than the lower surface of the conductive landing plugs.

* * * * *